(12) United States Patent
Johnstone et al.

(10) Patent No.: US 7,843,977 B2
(45) Date of Patent: Nov. 30, 2010

(54) LIGHT SOURCE THAT UTILIZES SMALL FOOTPRINT REFERENCE GAS CELLS FOR MULTIPLE LASER FREQUENCY STABILIZATION

(75) Inventors: Eric Stephen Johnstone, Redwood City, CA (US); Miao Zhu, San Jose, CA (US); Tirumala R. Ranganath, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 158 days.

(21) Appl. No.: 12/142,114

(22) Filed: Jun. 19, 2008

(65) Prior Publication Data

US 2009/0316740 A1    Dec. 24, 2009

(51) Int. Cl.
*H01S 3/10* (2006.01)
(52) U.S. Cl. ............. 372/20; 372/29.01; 372/29.011; 372/34; 372/29.02; 372/32
(58) Field of Classification Search ............ 372/20, 372/29.01, 20.011, 34, 20.02, 32, 29.02
See application file for complete search history.

(56) References Cited

U.S. PATENT DOCUMENTS

| | | | |
|---|---|---|---|
| 3,361,990 A * | 1/1968 | Gordon et al. | 372/32 |
| 4,494,085 A * | 1/1985 | Goldberg | 331/94.1 |
| 6,865,196 B2 * | 3/2005 | Dobbs et al. | 372/20 |
| 2004/0035356 A1 * | 2/2004 | Zappettini et al. | 117/84 |
| 2008/0128622 A1 * | 6/2008 | Weidmann | 250/343 |

\* cited by examiner

*Primary Examiner*—Minsun Harvey
*Assistant Examiner*—Kinam Park (57) ABSTRACT

A light source and the method for operating the same are disclosed. The light source includes first and second lasers, and first and second wavelength control assemblies. The lasers emit first and second light beams, respectively, at wavelengths that are determined by first and second wavelength control signals. First and second beam splitters split the first and second light beams, respectively, to create first and second sampling light beams. The first and second wavelength control assemblies receive sampling light beams and generate the first and second wavelength control signals such that the wavelengths of the first and second light beams differ by no more than a predetermined amount. The first and second wavelength control assemblies each include an absorption cell having a gas that has an optical absorption that varies with the wavelength of the first and second sampling light beams at wavelengths around the output wavelength of the light source.

23 Claims, 5 Drawing Sheets

LIGHT SOURCE THAT UTILIZES SMALL FOOTPRINT REFERENCE GAS CELLS FOR MULTIPLE LASER FREQUENCY STABILIZATION

BACKGROUND OF THE INVENTION

The power available from a single semiconductor laser is limited. In many applications, power levels in excess of one watt are required. For example, communication applications at wavelengths of about 1.5 micrometers (μm) can require more power than the power that can be provided by a single laser diode.

In principle, the light from a number of laser diodes of the same type can be combined to provide a light source with an output power level greater than the power level that can be obtained with a single laser. Unfortunately, the individual laser diodes emit light at slightly different wavelengths, and hence, the resulting light source has an emission spectrum that is too broad for many applications.

To overcome this problem, some form of servo loop could, in principle, be utilized to tune each of the individual laser diodes to the desired frequency. In such a system, a portion of the output laser light from the laser diode to be regulated is directed into a cell that has a gas with an atomic or molecular absorption line at the desired wavelength. Such gas will be referred to as absorption gas. There will be a maximum in the absorption level when the wavelength of the laser is at the center of the wavelength of the absorption line. In some special methods, e.g., saturation spectroscopy, there will a local minimum in the absorption level when the wavelength of the laser is at the center of the wavelength of the absorption line. The output wavelength of the laser is continuously adjusted to maintain the absorption at the desired level.

The output wavelength of the individual laser diodes can be controlled by varying the current through the laser diode or by controlling the temperature of the laser diode. A servo loop based on the absorption of the laser light by a gas cell can be used to servo the temperature and/or current through the laser. For example, hydrogen cyanide and acetylene have molecular absorption bands at wavelengths suitable for use in a feedback loop to lock the lasers at wavelengths around 1.5 μm. In this type of system, the laser wavelength is adjusted to maintain the absorption of the laser light in the cell at a predetermined level.

Unfortunately, the wavelength at which the cell has an absorption maximum depends on a number of factors in addition to the type of absorption gas in the cell. The location of the absorption maximum depends on the pressure, temperature, and electric and magnetic fields on the cell, and impurities in the absorption gas within the cell. Since these additional factors can vary from cell to cell, this type of servo mechanism presents problems when multiple cells are used to control multiple lasers.

In addition, servo mechanisms in which the laser wavelength is dithered to detect the location of the wavelength relative to the absorption maximum further increase the effective line width of the laser source. In such systems, the output wavelength is intentionally changed back and forth between two different wavelengths and the absorption measured at each wavelength to determine if the laser is currently adjusted to the correct wavelength. This constant dithering broadens the output spectrum even when the laser is correctly adjusted. To avoid this spectrum broadening, the frequency dithering can be implemented using a frequency modulator or a phase modulator. However, this approach increases the cost of the servo loop.

Furthermore, the servo mechanism must be insensitive to fluctuations in the power output of the laser and fluctuations in the polarization of the laser output. The portion of the laser output light that is delivered to the gas cell is typically provided on an optical fiber. If the fiber moves, the polarization of the light delivered to the cell changes.

SUMMARY OF THE INVENTION

The present invention includes a light source and the method for operating the same. The light source generates light of an output wavelength and includes first and second lasers, first and second wavelength control assemblies and an environmental control system. The first and second lasers emit first and second light beams, respectively, at wavelengths that are determined by the first and second wavelength control signals, respectively. The light source also includes first and second beam splitters that split the first and second light beams, respectively, to create first and second sampling light beams, respectively. The first and second wavelength control assemblies receive the first and second sampling light beams, respectively, and generate the first and second wavelength control signals, such that the wavelengths of the first and second light beams differ by no more than a predetermined amount. The first and second wavelength control assemblies each include an absorption cell having an absorption gas that has an optical absorption that varies with the wavelength of the first and second sampling light beams at wavelengths around the output wavelength; and a first photodetector that measures an intensity of light leaving that absorption cell. The environmental control system maintains the first and second absorption cells at a predetermined temperature.

In one embodiment, the first and second absorption cells each include an absorption gas and are in communication with one another such that the pressure and gas composition in the first absorption cell is the same as the pressure and gas composition in the second absorption cell.

In one embodiment, the first and second absorption cells are in a common housing having a gas-permeable barrier separating the first and second absorption cells, the gas permeable barrier blocking light from one of the absorption cells from reaching the other of the absorption cells.

In one embodiment, each of the absorption cells also includes a buffer gas that reduces diffusion of gas from one of the absorption cells into the other of the absorption cells. The buffer gas is chemically inert with respect to the absorption gas and does not have an optical transmission as a function of wavelength that varies with wavelength significantly at wavelengths near the output wavelength. In another embodiment, the buffer gas quenches fluorescence of the absorption gas.

In one embodiment, the environmental control system includes a housing surrounding the absorption cells. The housing includes a temperature control system that reduces temperature fluctuations within the housing. In one embodiment, the housing includes an electromagnetic field generator that reduces differences in the electromagnetic fields in each of the absorption cells.

In one embodiment, each of the wavelength control assemblies also includes an intensity measurement assembly that measures an intensity of the sampling light beam incident on that wavelength control assembly. The wavelength control signal generated by that wavelength control assembly is determined by the intensity of light leaving the absorption cell in the wavelength control assembly and the measured intensity of light of the sampling light beam.

DETAILED DESCRIPTION OF THE PREFERRED EMBODIMENTS OF THE INVENTION

Figure 1:
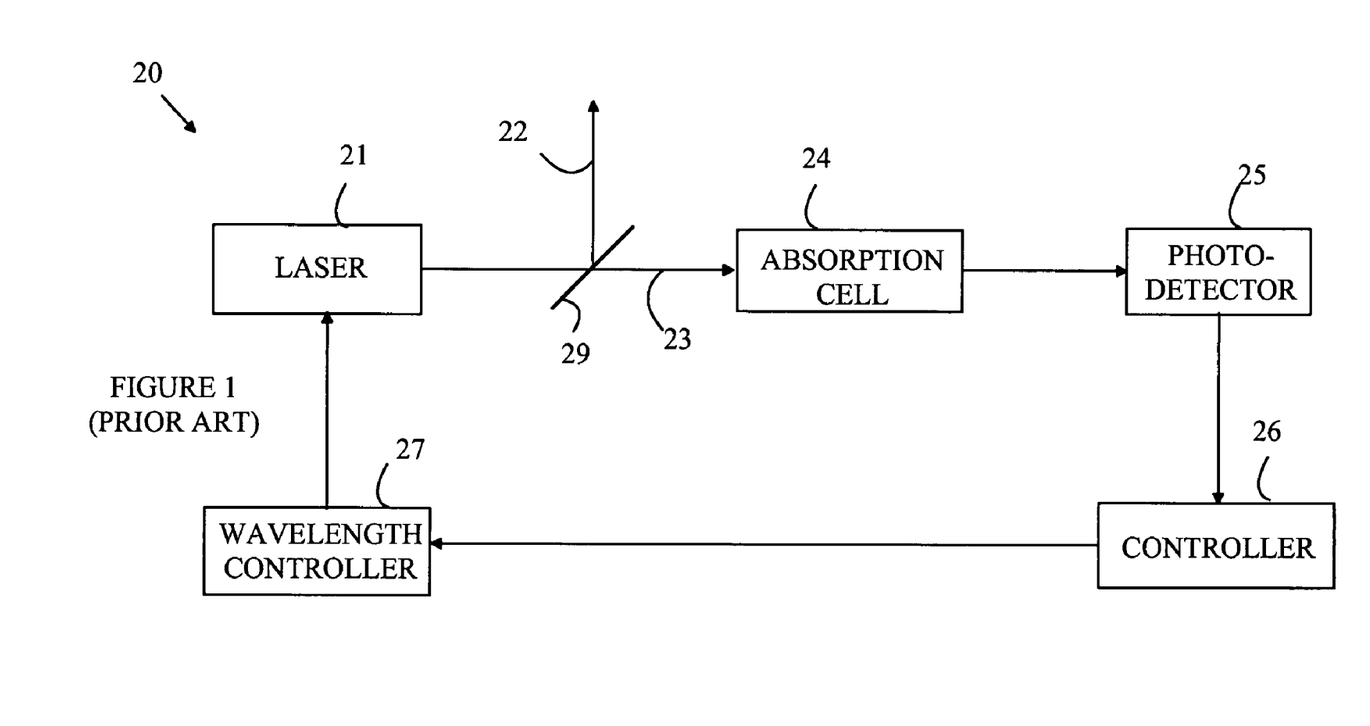
FIGS. 1 and 2 illustrate a typical prior art light source that utilizes a wavelength servo system.
Figure 2:
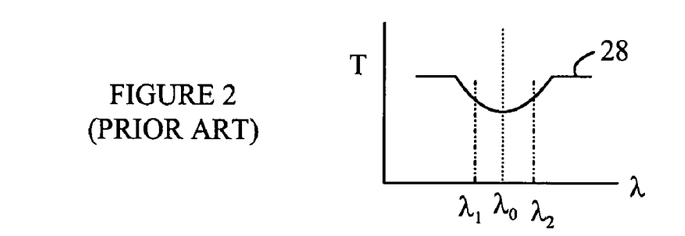

The manner in which the present invention provides its advantages can be more easily understood with reference to FIGS. 1 and 2, which illustrate a typical prior art light source that utilizes a wavelength servo system. In the following discussions, the absorbent maximum is used as an example. But embodiments can also be constructed that utilize a local absorbent minimum. Light source 20 utilizes a laser 21 that has an output wavelength that can be controlled by appropriate signals to a wavelength controller 27. The output beam from laser 21 is split into two beams 22 and 23 by a beam splitter 29, the majority of the power being devoted to beam 22. Beam 23 is directed into an absorption cell 24 that contains an absorption gas having an absorption line centered at the desired wavelength, $\lambda_0$. The intensity of the light in beam 23 after that beams passes through the absorption gas is detected by photodetector 25. The output of photodetector 25 as a function of wavelength is illustrated in FIG. 2 by curve 28. Controller 26 receives the output of photodetector 25 and determines if the wavelength of beam 23 is at the absorption maximum. If the wavelength is off of the minimum in curve 28, controller 26 sends an appropriate control signal to wavelength controller 27, which in turn adjusts the output wavelength of laser 21.

Controller 26 typically determines the position of the output wavelength relative to $\lambda_0$ by dithering the wavelength of laser 21 between $\lambda_1$ and $\lambda_2$ that are symmetrically offset around the current output wavelength. If the current wavelength is at $\lambda_0$, the measured transmission at $\lambda_1$ and $\lambda_2$ will be the same. If the transmission at one of these wavelengths is greater than the transmission at the other wavelength, then the controller 26 causes the output wavelength to be shifted in the appropriate direction to make the transmissions at the two wavelengths the same. As noted above, this dithering operation broadens the spectrum of the laser line. For some applications, this broadening poses significant problems.

Hence, servo algorithms that do not employ this dithering strategy are preferred for some applications. For example, if the laser wavelength is initially set by using the dithering strategy during a setup phase, the laser can be adjusted by maintaining the absorption at a predetermined value. In this case, the laser output wavelength is held at a value that is offset from $\lambda_0$. If the output of photodetector 25 is greater than the predetermined value, the laser output wavelength is adjusted in the direction of the absorption maximum. If the output of photodetector 25 is less than the predetermined value, the laser output wavelength is adjusted away from the absorption maximum.

Unfortunately, this algorithm only functions properly if the intensity of light entering absorption cell 24 remains constant. If the intensity of light from the laser varies, the servo system will interpret the resulting change in intensity of light leaving absorption cell 24 as a shift in the wavelength of the laser light and erroneously adjust the output wavelength of the laser. Similarly, if the reflection coefficient from beam splitter 29 depends on the polarization of the light striking the beam splitter, a change in intensity at photodetector 25 will result if the polarization of the light striking beam splitter 29 changes. In this regard, it should be noted that light from laser 21 is often coupled to beam splitter 29 by an optical fiber. Mechanical movement of the optical fiber can alter the polarization of the light delivered to beam splitter 29. Alternatively, the beam splitter 29 can be implemented using a fiber coupler.

Finally, as noted above, $\lambda_0$ is a function of a number of other variables in addition to the choice of absorption gas in absorption cell 24. Hence, two lasers that are individually adjusted by separate servo systems can still have different output wavelengths if any of these variables differ significantly between the servo systems. In general, the location of the absorption maximum in the absorption cell changes with temperature, pressure of the gas in the cell, impurities in the absorption cell, and the electric and magnetic fields within the absorption cells. Hence, to assure that the two lasers are adjusted to the same wavelength, all of these variables must be maintained at the same level between the two absorption cells.

Figure 3:
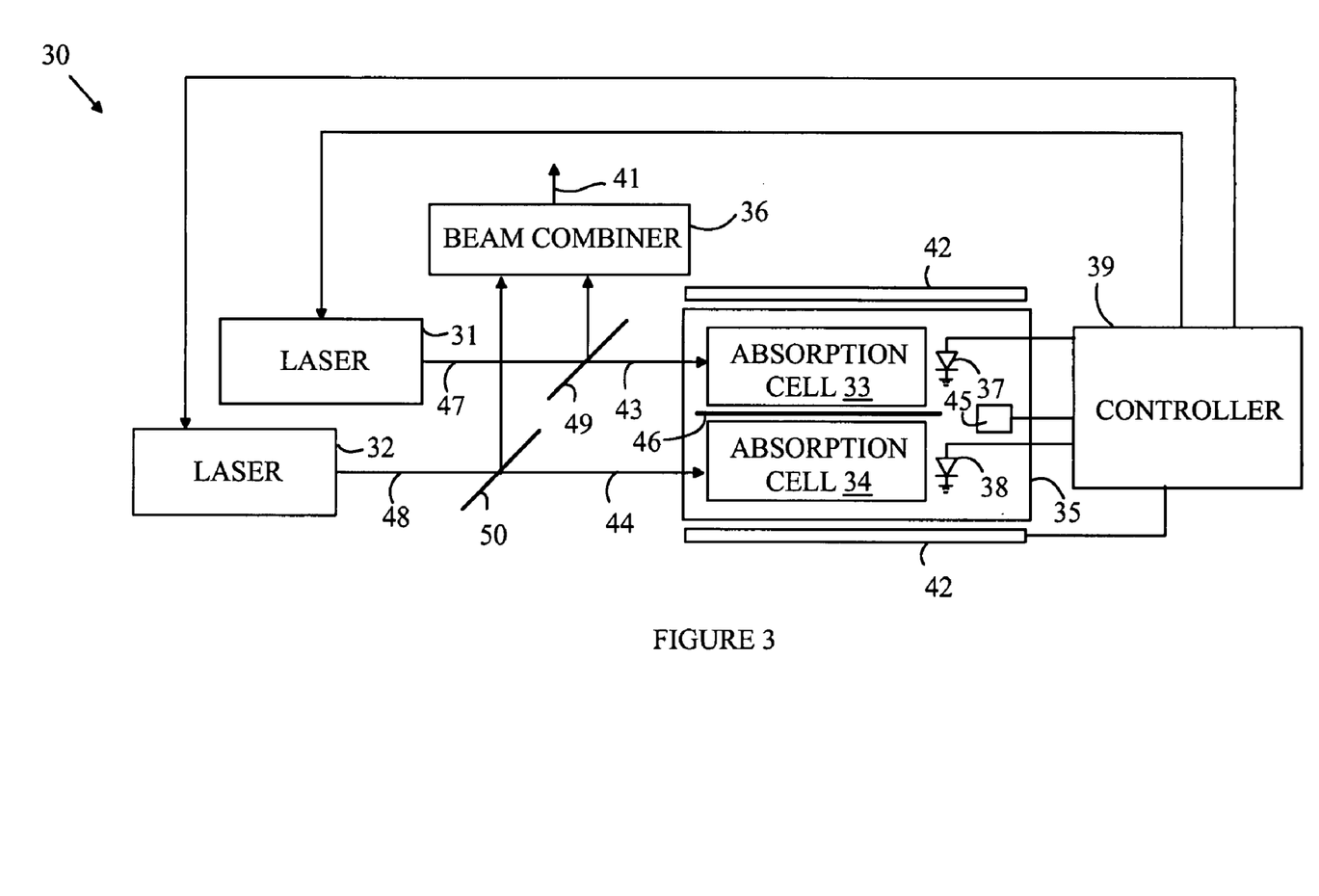
FIG. 3 illustrates a light source according to one embodiment of the present invention.

Refer now to FIG. 3, which illustrates a light source according to one embodiment of the present invention. Light source 30 includes lasers 31 and 32. The beam output by each laser is split into two portions, a main beam and a sampling beam, by a respective beam splitter 49, 50. Each main beam is directed to a beam combiner 36 that combines the main beams to form an output beam 41. In some applications, the individual lasers are used to separately power devices that are required to have light sources at the same wavelength, e.g., an array of interferometers for position measurements. In this case, the two main laser beams are not combined at all. Instead, one laser feeds several interferometers while the other laser feeds another group of interferometers. The laser frequencies (wavelengths) have to be the same in this application so that the measurement results can be used interchangeably. The sampling beam from laser 31 is directed into an absorption cell 33 by an optical fiber 43. The intensity of the light leaving absorption cell 33 is detected by photodetector 37 whose output is provided to controller 39. Similarly, the sampling beam from laser 32 is directed into an absorption cell 34 by an optical fiber 44. The intensity of the light leaving absorption cell 34 is detected by photodetector 38 whose output is provided to controller 39. Controller 39 adjusts the output wavelength of each laser based on the observed intensities.

In one embodiment, lasers 31 and 32 are coupled to beam splitters 49 and 50 by polarization maintaining optical fibers 47 and 48, respectively. However, the beam splitters 49 and 50 can also be implemented as fiber couplers. In addition, optical fibers 43 and 44 can also be polarization maintaining fibers or polarizing fibers (i.e., fibers that selectively attenuate one of two orthogonal polarizations). Hence, mechanical movements of the optical fibers will not alter the polarization of the light striking beam splitters 49 and 50 or the polarization of the light entering the absorption cells. In this regard, it should be noted that while beam splitters 49 and 50 are ideally not polarization dependent, most commercially available beam splitters have some degree of polarization dependence, and hence, the intensity of the light entering the absorption cells could change due to mechanical movement of fibers 47 and 48 if these fibers are not polarization maintaining fibers.

The absorption cells are contained within a housing 35 that maintains the absorption cells at a constant temperature with the aid of a temperature control module 45 controlled by controller 39. In one embodiment, a baffle 46 is placed between the absorption cells and the photodetectors to prevent cross-talk between the absorption cells. While temperature control module 45 is shown inside of housing 35, embodiments in which the control module is located outside of the housing and independent of controller 39 can also be used.

In one embodiment, light source 30 includes a magnetic and/or electric field generator 42 that maintains a constant magnetic and/or electric field in housing 35 so that the absorption cells are subject to the same fields. The fields can also be used to fine-tune the absorption lines by controlling the degree of splitting on otherwise degenerate lines. In another embodiment, housing 35 is constructed to shield the external parasitic electromagnetic fields.

Figure 4:
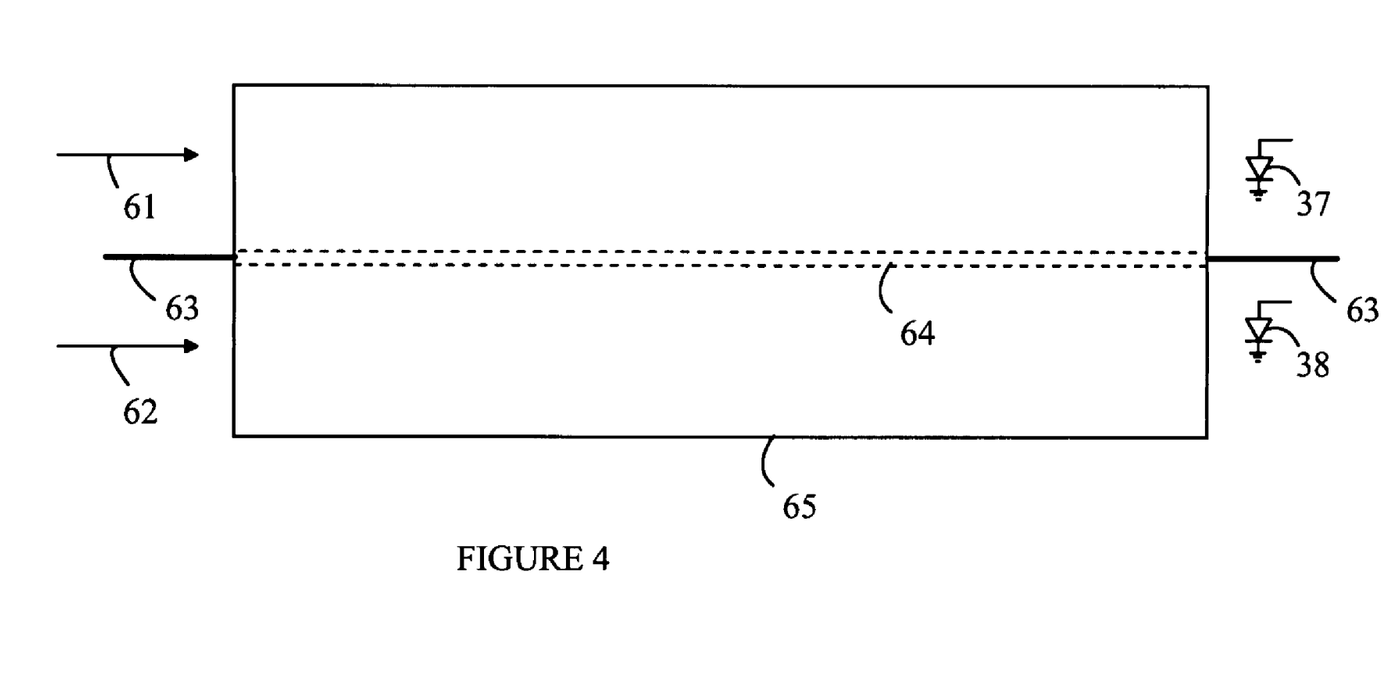
FIG. 4 illustrates an absorption cell that is utilized in the stabilization of two laser beams.

The above-described embodiments utilize a separate absorption cell for each laser beam. Individual differences in the absorption cells such as different pressures or levels of impurities in the absorption gas can lead to different wavelengths for the absorption line used to stabilize the laser frequencies. To overcome this problem, one class of embodiments of the present invention utilizes a single absorption cell to stabilize a plurality of lasers. Refer now to FIG. 4, which illustrates an absorption cell that is utilized in the stabilization of two laser beams 61 and 62. Absorption cell 65 includes an optical barrier 64 that prevents light transmission from one compartment to the other. In one embodiment, barrier 64 is gas permeable, and includes one or more holes that equalize the absorption gas pressure and gas composition on both sides of the barrier. In addition, a second barrier 63 external to absorption cell 65 assures that each photodetector only receives light from the corresponding compartment in absorption cell 65.

Cross-talk between the compartments of the absorption cell that results from molecules excited in one compartment traveling to the other compartment should be prevented. In one embodiment, the holes in barrier 64 are dimensioned to increase the time needed for the absorption gas in one compartment to diffuse into the other compartment so that a significant fraction of the absorption gas molecules excited in one compartment does not enter the other compartment before the excited absorption gas molecules return to the ground state.

Figure 5:
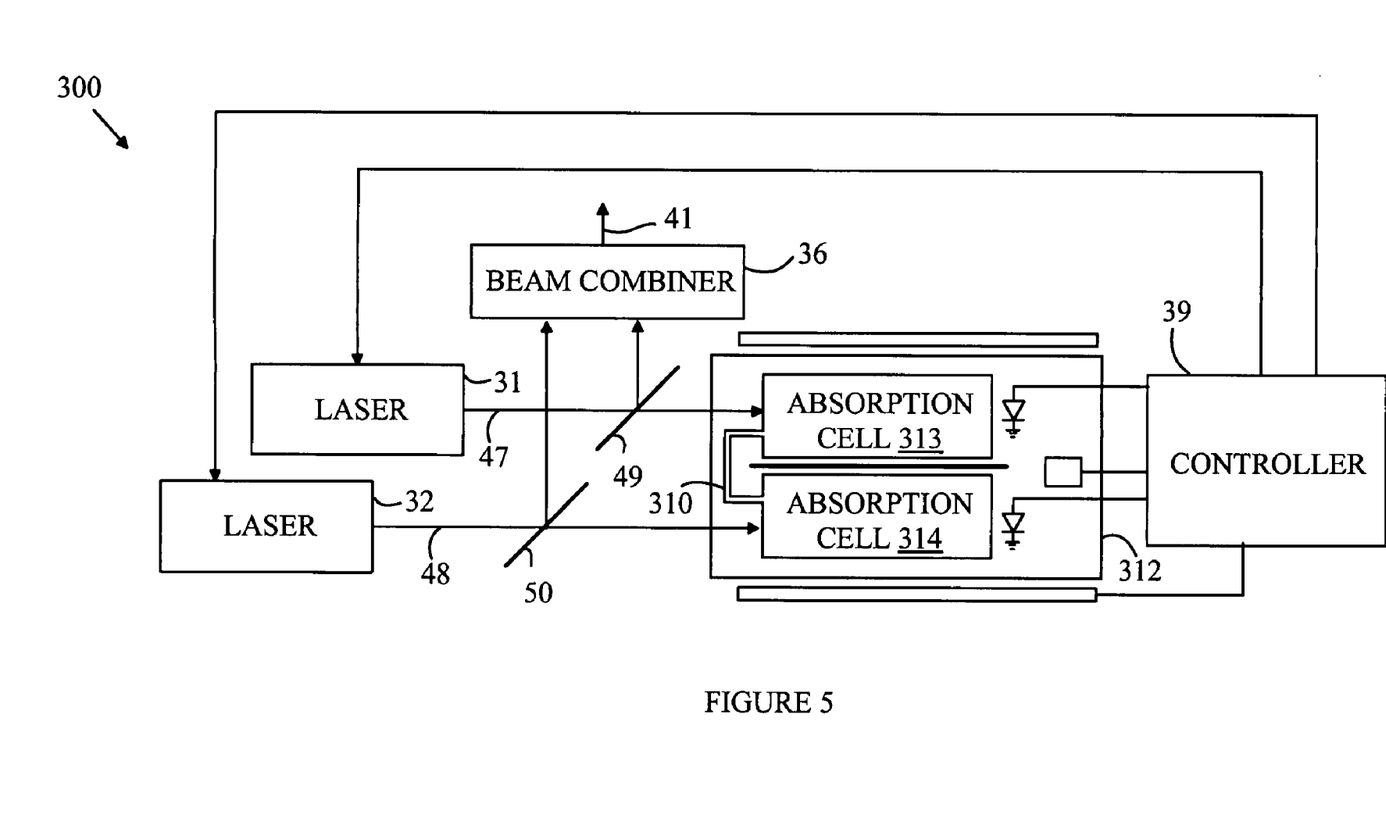
FIG. 5 illustrates another embodiment of a light source according to the present invention.

It should also be noted that embodiments in which the absorption cells are separate from one another and are connected by a tube or other channel that allows the absorption gas (and the undesired impurities) in one cell to be exchanged with the absorption gas (and the undesired impurities) in the other cell to equalize the composition of the gases in each cell and the pressure in the cells could also be constructed. Refer now to FIG. 5, which illustrates another embodiment of a light source according to the present invention. Light source 300 is similar to light source 30 discussed above, and hence, elements of light source 300 that serve functions analogous to elements of light source 30 have been given the same numerical designations and will not be discussed in detail here. Light source 300 includes a housing 312 that regulates the environment of absorption cells 313 and 314. Absorption cells 313 and 314 are connected by a passage 310 that equalizes the gas pressure and gas composition between absorption cell 314 and absorption cell 313.

A buffer gas can also be introduced into the absorption cell to further reduce cross-talk resulting from the exchange of excited gas molecules. The buffer gas has a number of properties. First, the buffer gas should have a large collision cross-section with respect to the molecules of the absorption gas. A buffer gas with this property will increase the diffusion time in the compartments, and hence, reduce the cross-talk.

Second, the buffer gas should not have any absorption bands at or near the wavelength of the absorption line of the absorption gas used for stabilizing the lasers. If this condition is not met, the wavelength of the laser could be set to a nearby buffer gas line instead of the desired stabilization line of the absorption gas. While the buffer gas can have some absorption, the absorption of the buffer gas in a wavelength range that includes the wavelength that is being maintained must not be a function of wavelength to the degree that it would interfere with the servo loop sufficiently to change the output wavelength of the lasers by more than the maximum error allowed in the output wavelength by the design specification for the light source. If the buffer gas does not cause the servo loop to settle on a wavelength that differs from the design wavelength by more than the maximum error specified in the design specification for the light source, the buffer gas is defined to have an absorption as a function of wavelength near the output wavelength that is insignificant.

Third, the buffer gas should quench any fluorescence of the absorption gas. Hence, if the absorption gas is excited to an excited state, the gas will be de-excited before it has time to move from one compartment to the other. This fluorescence-free de-excitation process helps to prevent the photons induced by one laser from interfering with the wavelength stabilization process of the other laser.

Finally, the buffer gas must be chemically inert with respect to absorption gas. It should be noted that for communication applications, the laser wavelength is of the order of 1.5 µm. Absorption lines in this range tend to be lines of molecules rather than atomic species. For example, acetylene ($C_2H_2$) and hydrogen cyanide (HCN) have absorption lines in the desired wavelength range. If the buffer gas chemically reacts with the absorption gas, the species providing the stabilization line will be lost.

Buffer gases that satisfy the inert requirement are typically nitrogen ($N_2$) and the noble gases. To provide a high collision cross-section, the larger atomic weight noble gases are preferred.

As noted above, prior art servo systems utilize dithering to determine the laser wavelength with respect to the spectral line of the absorption gas in the absorption cell. Dithering measures the absorption at two equally spaced wavelengths on each side of the current wavelength to determine if the laser wavelength is currently at the transmission minimum. Dithering has the advantage of providing a measurement that is independent of long-term changes in the light intensity of the laser. As long as the intensity of the laser remains constant over the time needed to change the laser wavelength to each of the test wavelengths and make the transmission measurements, small changes in the intensity of the light from the laser do not introduce errors in the wavelength at which the laser is stabilized. Unfortunately, as noted above, dithering increases the average line width of the light source by an amount that is approximately equal to the difference in wavelength between the two test wavelengths.

Figure 6:
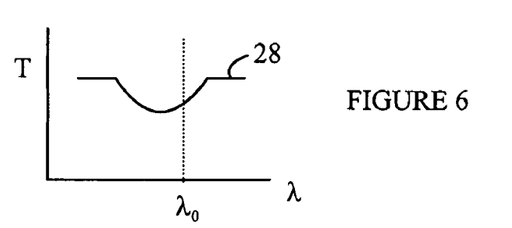
FIG. 6 illustrates the positioning of the target wavelength with respect to the transmission curve for the light source.

If the intensity of the laser did not vary, the servo loop could use the amplitude of the signal from the photodetector to adjust the laser wavelength. Refer now to FIG. 6, which illustrates the relationship between the target wavelength and to the transmission curve of the absorption cell. If the target wavelength $\lambda_0$ is offset from that of the transmission minimum of the absorbent cell, the intensity of the signal from the photodetector depends on the wavelength of the laser. Hence, by adjusting the wavelength such that the amplitude of the signal from the photodetector is constant, the wavelength of the laser will also be held constant at the desired value without the need to dither the laser wavelength.

Figure 7:
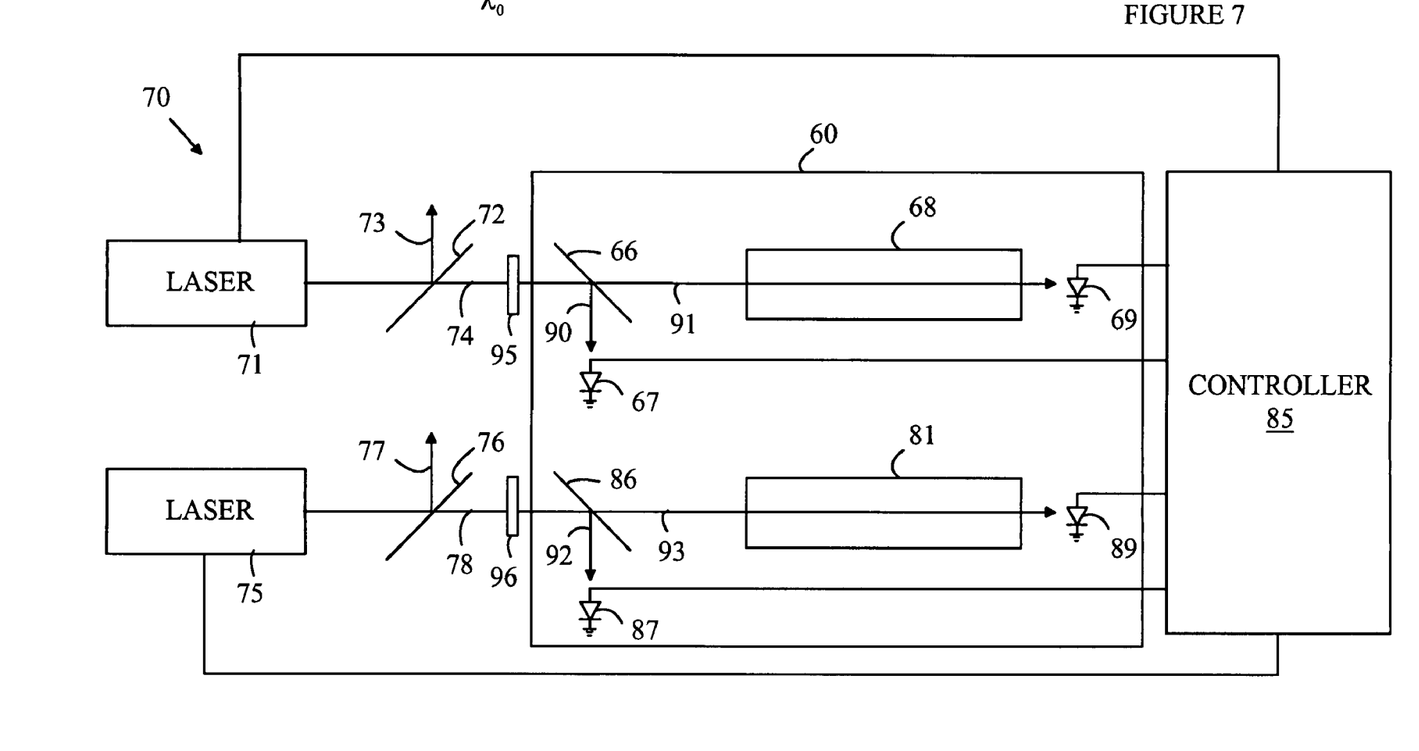
FIG. 7 illustrates another embodiment of a light source according to the present invention.

As noted above, the intensity of the light from the laser varies over time, and hence, any such servo scheme must measure both the intensity of the light generated by the laser and the amplitude of the signal from the photodetector. Refer now to FIG. 7, which illustrates another embodiment of a light source according to the present invention. Light source 70 combines the light generated by lasers 71 and 75. The wavelength of the light output by laser 71 is controlled by an absorption cell feedback loop that utilizes absorption cell 68, and the wavelength of the light output by laser 75 is controlled by an absorption cell feedback loop that utilizes absorption cell 81. While light source 70 utilizes two absorption cells, it is to be understood that the absorption cells could be part of a common absorption cell as discussed above.

The light output by laser 71 is split into two beams 73 and 74 by beam splitter 72. Beam 73 is combined with light from one or more similar lasers as discussed above to provide the output beam of light source 70. Beam 74 is directed to housing 60 that contains absorption cells 68 and 81. Beam 74 is split into two beams 90 and 91 by beam splitter 66 prior to entering absorption cell 68. Beam 90 is directed to photodetector 67 that measures its intensity. Beam 91 passes through absorption cell 68 and is incident on photodetector 69. Photodetector 69 measures the residual intensity of beam 91 after absorption by absorption cell 68. Similarly, the light of laser 75 is split into two beams 77 and 78 by beam splitter 76. Beam 77 is combined with beam 73 in a manner analogous to that discussed above. Beam 78 is directed to housing 60. Beam 78 is split into two beams, 92 and 93, by beam splitter 86 prior to entering absorption cell 81. Beam 92 is directed to photodetector 87 that measures its intensity. Beam 93 passes through absorption cell 81 and is incident on photodetector 89. Photodetector 89 measures the residual intensity of beam 93 after absorption by absorption cell 81. Controller 85 adjusts the wavelengths of lasers 71 and 75 such that the ratio of the amplitudes of the electrical signals generated by photodetectors 69 and 67 and the ratio of the amplitudes of the electrical signals generated by photodetectors 89 and 87 are maintained at predetermined values, respectively.

As noted above, it is advantageous for the light sources to utilize optical components whose properties do not depend on the polarization of the incident light. Accordingly, beam splitters 72 and 76 each comprise partially reflecting coatings on a suitable transparent substrate. Similarly, light beams 74 and 78 can be coupled to housing 60 by polarization-maintaining fibers so that mechanical movement of the fibers does not substantially alter the polarization of the light entering housing 60. In one embodiment, polarizers 95 and 96 are placed in front of beam splitters 66 and 86, respectively. Even when polarization maintaining fibers are used to couple the light from beam splitters 72 and 76 to housing 60, there is some variation in the polarization of the light when the fibers are moved. The polarizers 95 and 96 assure that the polarizations of the light reaching the beam splitters 66 and 86 are well defined. In one embodiment, the polarizers 95 and 96 are located inside the housing 60.

In one embodiment, photodetectors 67, 69, 87, and 89 are located within housing 60. This arrangement assures that each of the photodetectors is maintained at the same temperature and within the same electro-magnetic environments as the others of the photodetectors to minimize any dependence of the signals from theses devices on temperature or electromagnetic field variations.

Various modifications to the present invention will become apparent from the foregoing description and accompanying drawings. Accordingly, the present invention is to be limited solely by the scope of the following claims.

What is claimed is:

1. A light source that generates light of an output wavelength, said light source comprising:
    first and second lasers that emit first and second light beams, respectively, at wavelengths that are determined by first and second wavelength control signals, respectively;
    first and second beam splitters that split said first and second light beams, respectively, to create first and second sampling light beams, respectively;
    first and second wavelength control assemblies that receive said first and second sampling light beams, respectively, and generate said first and second wavelength control signals, respectively, such that said wavelengths of said first and second light beams differ by no more than a predetermined amount, said first and second wavelength control assemblies receiving said first and second sampling light beams, respectively, said first and second wavelength control assemblies each comprising:
        an absorption cell having a gas that has an optical absorption that varies with said wavelength of said first and second sampling light beams at wavelengths around said output wavelength; and
        a first photodetector that measures an intensity of light leaving that absorption cell; and
    an environmental control system that maintains said absorption cells in said first and second wavelength control assemblies at a predetermined temperature.

2. The light source of claim 1 wherein said absorption cells in said first and second wavelength control assemblies each include an absorption gas having a respective pressure and gas composition and are in communication with one another such that said pressure and said gas composition in said absorption cells of said first wavelength control assembly is the same as said gas composition and pressure in said absorption cell of said second wavelength control assembly.

3. The light source of claim 1 further comprising a baffle disposed between said absorption cells, said baffle preventing light from one of said absorption cells from reaching the other of said absorption cells.

4. The light source of claim 1 wherein each of said absorption cells comprises a separate housing that contains said gas.

5. The light source of claim 2 wherein said absorption cells are in a common housing having a gas permeable barrier separating said absorption cells, said gas permeable barrier blocking light from one of said absorption cells from reaching the other of said absorption cells.

6. The light source of claim 2 wherein each of said absorption cells further comprises a buffer gas that reduces the diffusion rate of said absorption gas from one of said absorption cells into the other of said absorption cells.

7. The light source of claim 6 wherein said buffer gas is chemically inert with respect to said absorption gas.

8. The light source of claim 6 wherein said buffer gas does not have an optical transmission as a function of wavelength that varies with wavelength significantly at wavelengths near said output wavelength.

9. The light source of claim 6 wherein said buffer gas quenches fluorescence of said absorption gas.

10. The light source of claim 6 wherein said buffer gas comprises a gas chosen from the group consisting of nitrogen and the noble gases.

11. The light source of claim 1 wherein said environmental control system comprises:
a housing surrounding said absorption cells, said housing comprising a temperature control system that reduces temperature fluctuations within said housing.

12. The light source of claim 11 wherein said housing comprises an electromagnetic shield that shields said wavelength control assemblies from electromagnetic fields external to said housing.

13. The light source of claim 11 wherein said housing comprises a magnetic field generator that reduces differences in a magnetic field between said absorption cells.

14. The light source of claim 11 wherein said housing comprises an electric field generator that reduces differences in electric field between said absorption cells.

15. The light source of claim 1 wherein each of said wavelength control assemblies further comprises an intensity measurement assembly that measures an intensity of said sampling light beam incident on that wavelength control assembly, said wavelength control signal generated by that wavelength control assembly being determined by said intensity of light leaving said absorption cell in said wavelength control assembly and said measured intensity of light of said sampling light beam.

16. The light source of claim 15 wherein each of said intensity measurement assemblies comprises a beam splitter and a second photodetector.

17. The light source of claim 16 wherein said environmental control system comprises a housing surrounding said wavelength control assemblies and wherein said first and second photodetectors are within said housing.

18. The light source of claim 1 wherein said first and second sampling light beams are coupled to said first and second wavelength control assemblies by polarization maintaining optical fibers or polarizing optical fibers.

19. The light source of claim 18 further comprising first and second polarizers that operate on said first and second sampling light beams after said first and second sampling light beams leaving said polarization maintaining optical fibers or said polarizing optical fibers.

20. A method for controlling the output wavelength of a light source having first and second lasers that emit light at wavelengths that are determined by first and second wavelength control signals, respectively, said method comprising:
splitting light beams from said first and second lasers to form first and second sampling light beams, respectively;
measuring an intensity of each of said first and second sampling light beams after that sampling light beam has passed through a corresponding one of first and second absorption cells, respectively, each absorption cell having a gas that has an optical absorption that varies with said wavelength of said first and second sampling light beams at wavelengths around said output wavelength;
maintaining said first absorption cell at substantially the same temperature as said second absorption cell; and
generating said first and second wavelength control signals in response to said measured intensities such that each of said measured intensities of light is maintained at a predetermined value and said first and second light beams have substantially the same wavelength.

21. The method of claim 20 wherein said first and second absorption cells include the same gas held at the same pressure and are held at the same temperature.

22. The method of claim 20 wherein said first and second absorption cells are located in substantially the same electromagnetic field.

23. The method of claim 20 wherein said first and second absorption cells are in communication with one another such that gases can diffuse from one of said absorption cells to the other of said absorption cells.

* * * * *

UNITED STATES PATENT AND TRADEMARK OFFICE
CERTIFICATE OF CORRECTION

| | | |
|---|---|---|
| PATENT NO. | : 7,843,977 B2 | Page 1 of 1 |
| APPLICATION NO. | : 12/142114 | |
| DATED | : November 30, 2010 | |
| INVENTOR(S) | : Eric Stephen Johnstone et al. | |

It is certified that error appears in the above-identified patent and that said Letters Patent is hereby corrected as shown below:

In column 8, line 39, in Claim 2, delete "cells" and insert --cell--, therefor.

Signed and Sealed this
Twenty-fifth Day of January, 2011

David J. Kappos
*Director of the United States Patent and Trademark Office*